US011081377B2

(12) United States Patent
Goto et al.

(10) Patent No.: US 11,081,377 B2
(45) Date of Patent: Aug. 3, 2021

(54) SUBSTRATE PROCESSING SYSTEM

(71) Applicant: TOKYO ELECTRON LIMITED, Tokyo (JP)

(72) Inventors: Ryota Goto, Nirasaki (JP); Kiyoshi Suzuki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 119 days.

(21) Appl. No.: 16/598,145

(22) Filed: Oct. 10, 2019

(65) Prior Publication Data

US 2020/0118851 A1    Apr. 16, 2020

(30) Foreign Application Priority Data

Oct. 10, 2018    (JP) .............................. JP2018192025

(51) Int. Cl.
| | |
|---|---|
| *B65G 49/07* | (2006.01) |
| *H01L 21/67* | (2006.01) |
| *H01L 21/677* | (2006.01) |
| *H01L 21/687* | (2006.01) |

(52) U.S. Cl.
CPC ........ *H01L 21/67253* (2013.01); *B65G 49/07* (2013.01); *H01L 21/6773* (2013.01); *H01L 21/67259* (2013.01); *H01L 21/67781* (2013.01); *H01L 21/68742* (2013.01); *H01L 21/67161* (2013.01); *H01L 21/67167* (2013.01); *H01L 21/67196* (2013.01); *H01L 21/67201* (2013.01); *H01L 21/67742* (2013.01); *H01L 21/67745* (2013.01); *H01L 21/67754* (2013.01)

(58) Field of Classification Search
CPC ........... H01L 21/67259; H01L 21/6773; H01L 21/67781; H01L 21/68742; H01L 21/67161; H01L 21/67167; H01L 21/67196; H01L 21/67201; H01L 20/67742; H01L 21/67745; H01L 21/67754
See application file for complete search history.

(56) References Cited

U.S. PATENT DOCUMENTS

| 2014/0107825 A1* | 4/2014 | Kubodera .......... G05B 19/4189 700/112 |
| 2015/0019004 A1* | 1/2015 | Hiroki ................... B25J 9/1664 700/228 |
| 2015/0170945 A1* | 6/2015 | Segawa ............. H01L 21/67772 414/217 |

FOREIGN PATENT DOCUMENTS

JP    2013082031 A    5/2013

* cited by examiner

*Primary Examiner* — Seahvosh Nikmanesh
(74) *Attorney, Agent, or Firm* — Nath, Goldberg & Meyer; Jerald L. Meyer; Tanya E. Harkins

(57) ABSTRACT

A substrate processing system comprising: a first chamber comprising loading tables, on which a plurality of substrates are to be loaded; a second chamber comprising loading tables, on which a plurality of substrates are to be loaded; a first transfer device comprising a plurality of blades configured to hold a plurality of substrates in a lengthwise direction thereof, and configured to transfer a plurality of substrates loaded on the loading tables of the first chamber to the loading tables of the second chamber with the substrates held at the same height; a substrate sensor provided on paths, along which the blades enter the second chamber, and configured to detect a substrate held by the blades; and a controller configured to control the first transfer device.

16 Claims, 12 Drawing Sheets

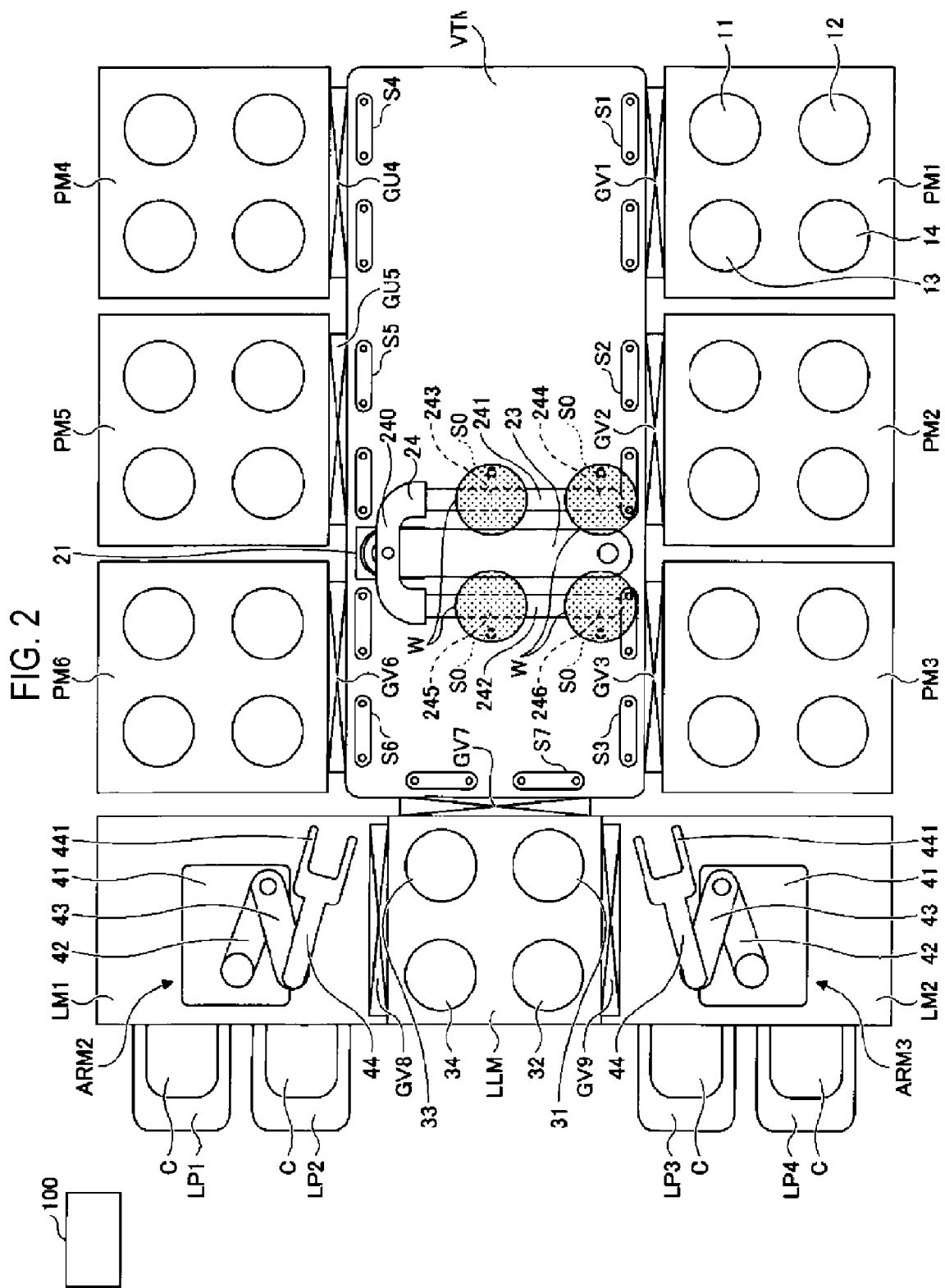

FIG. 6A
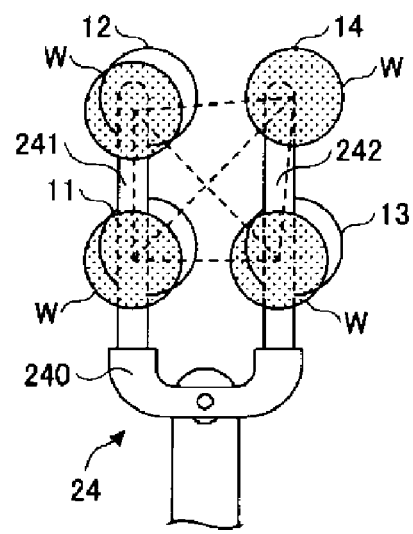
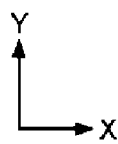
FIG. 6B
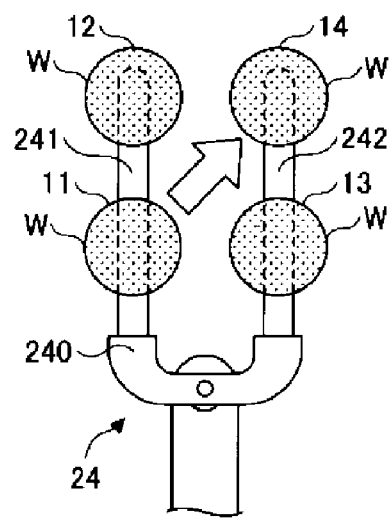

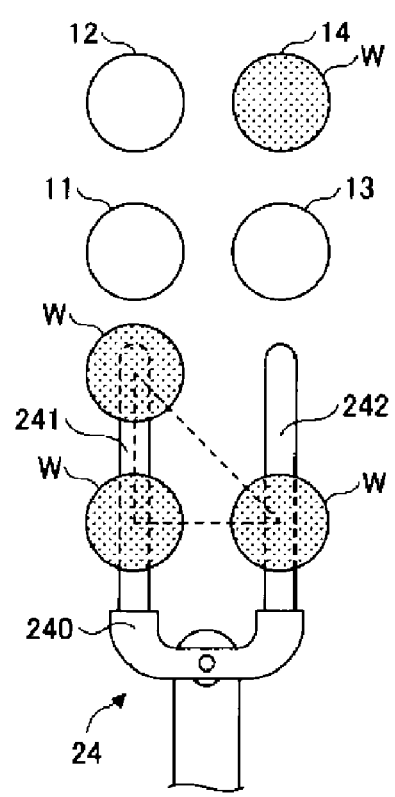

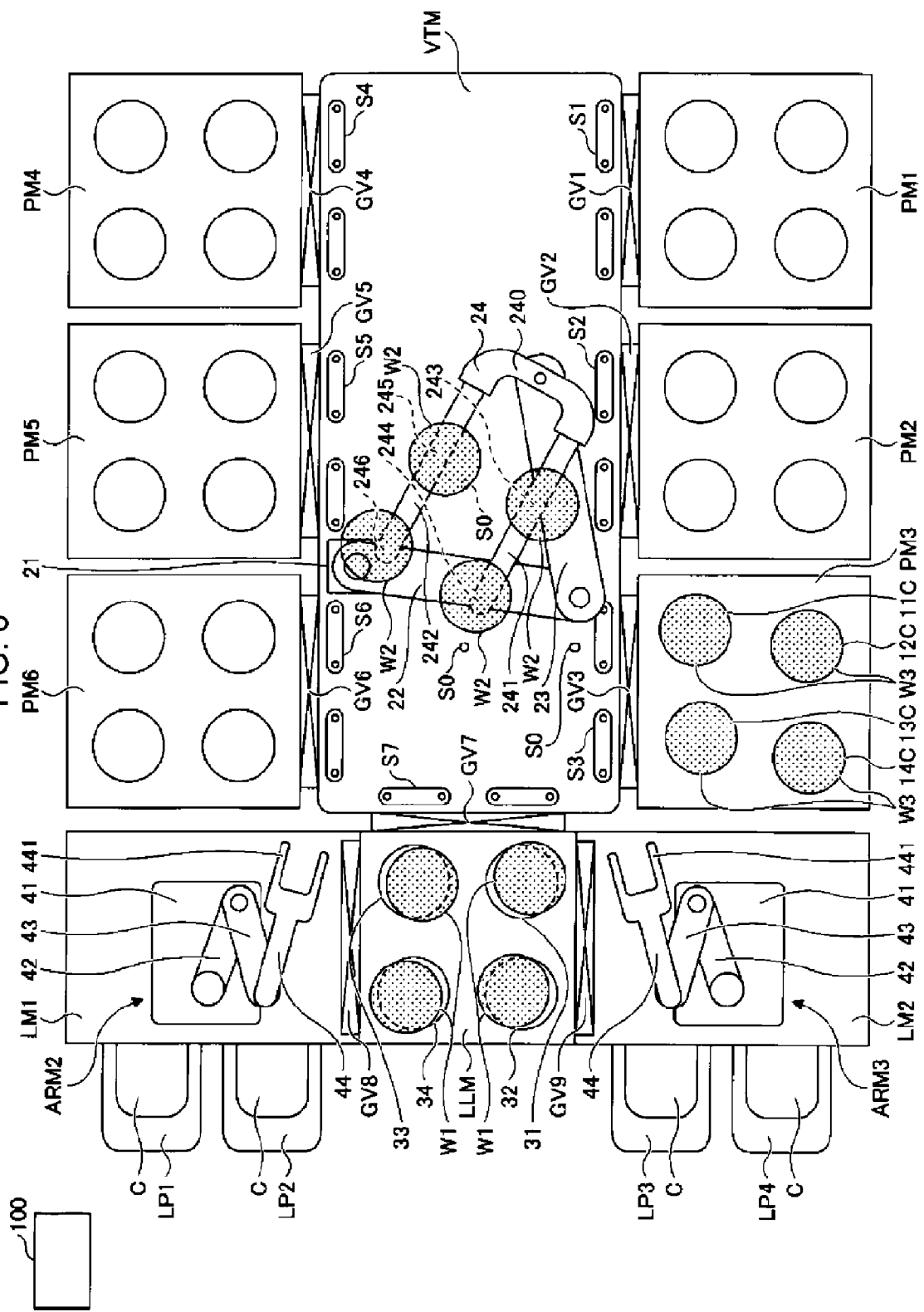

SUBSTRATE PROCESSING SYSTEM

CROSS-REFERENCE TO RELATED APPLICATION

This application is based upon and claims the benefit of priority from Japanese Patent Application No. 2018-192025, filed on Oct. 10, 2018, the entire contents of which are incorporated herein by reference.

TECHNICAL FIELD

The present disclosure relates to a substrate processing system.

BACKGROUND

For example, a transfer arm that transfers wafers to process chambers configured to perform a desired process, such as film forming, on wafers is known.

Patent document 1 discloses a transfer robot having an upper transfer mechanism and a lower transfer mechanism.

PRIOR TECHNICAL DOCUMENTS

Patent Documents

Japanese Patent Application Publication No. 2013-82031

SUMMARY

According to an embodiment, there is provided a substrate processing system that includes a first chamber comprising loading tables, on which a plurality of substrates are to be loaded; a second chamber comprising loading tables, on which a plurality of substrates are to be loaded; a first transfer device comprising a plurality of blades configured to hold a plurality of substrates in a lengthwise direction thereof, and configured to transfer a plurality of substrates loaded on the loading tables of the first chamber to the loading tables of the second chamber with the substrates held at the same height; a substrate sensor provided on paths, along which the blades enter the second chamber, and configured to detect a substrate held by the blades; and a controller configured to control the first transfer device.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a plan view illustrating a configuration of an example of a substrate processing system according to an embodiment;

FIGS. 6A and 6B illustrate plan diagrams illustrating another example of calibrating a location of a wafer;

FIGS. 7A to 7C illustrate plan diagrams illustrating another example of calibrating a location of a wafer; and FIG. 8 is a plan view illustrating a configuration of an example of a substrate processing system according to another embodiment.

DETAILED DESCRIPTION

Figure 1:
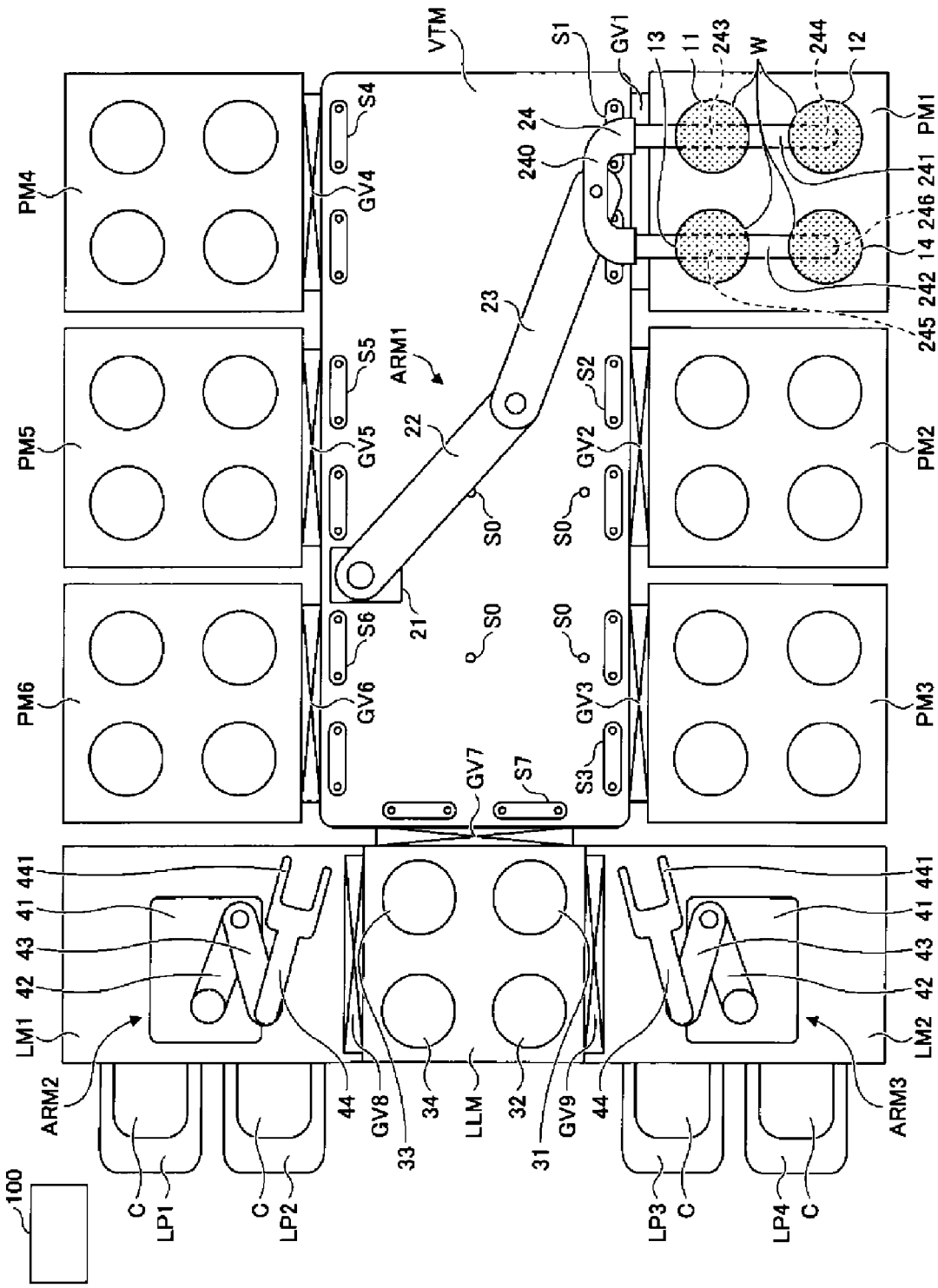
FIG. 1 is a plan view illustrating a configuration of an example of a substrate processing system according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, an embodiment for carrying out the present disclosure will be described with reference to the drawings. In the drawings, the same reference numerals are given to the same configurations, and a repeated description thereof may be omitted.

<Substrate Processing System>

An example of an entire configuration of a substrate processing system according to an embodiment will be described with reference to FIGS. 1 and 2. FIGS. 1 and 2 are plan views illustrating a configuration of an example of a substrate processing system according to an embodiment. FIG. 1 illustrates a state in which a semiconductor wafer W is carried into a process chamber PM1. FIG. 2 illustrates a state in which an end effector 24 of a transfer device ARM1 is located at a reference location. The wafer W is illustrated using dotted-hatching.

The substrate processing system illustrated in FIG. 1 is a system of a cluster structure (a multi-chamber type). The substrate processing system includes process chambers (process modules) PM1 to PM6, a vacuum transfer module VTM, a load lock module LLM, loader modules LM1 to LM2, load ports LP1 to LP4, and a controller 100.

The pressures of the process chamber PM1 to PM6 are reduced to a predetermined vacuum atmosphere, and a desired process (etching, film forming, cleaning, ashing, or the like) is performed on a semiconductor wafer W (hereinafter, referred to as "a wafer W") in the interior thereof. The process chambers PM1 to PM6 are arranged adjacent to the vacuum transfer module VTM. The process chambers PM1 to PM6 and the vacuum transfer module VTM communicate with each other through opening and closing of gate valves GV1 to GV6. The process chamber PM1 has loading tables 11 to 14, on which a total of four wafers W are loaded in a 2 by 2 matrix when viewed in a plane. Similarly, each of the process chambers PM2 to PM6 has a loading table, on which four wafers W are loaded. Further, operations for processing in each of the process chambers PM1 to PM6 are controlled by the controller 100.

The pressure of the vacuum transfer module VTM is reduced to a predetermined vacuum atmosphere. Further, a transfer device ARM1 that transfers the wafer W is provided in the interior of the vacuum transfer module VTM. The transfer device ARM1 carries in and out the wafer W between the process chambers PM1 to PM6 and the vacuum transfer module VTM as the gate valves GV1 to GV6 are opened and closed. Further, the transfer device ARM1 carries in and out the wafer W between the load lock module LLM and the vacuum transfer module VTM as the gate valve GV7 is opened and closed. Further, the operation of the transfer device ARM1 and the opening and closing of the gate valves GV1 to GV7 are controlled by the controller 100.

The transfer device ARM1 includes a multi-joint arm including a base 21, a first link 22, a second link 23, and an end effector 24. One end of the first link 22 is mounted on the base 21 to be rotatable upwards and downwards about a rotational axis. Further, the base 21 may elevate the first link 22 in an upward/downward direction. One end of the second link 23 is mounted to be rotatable while taking an upward/downward direction as a rotational axis as compared with an opposite end of the first link 22. A proximal end of the end effector 24 is mounted to be rotatable while taking an upward/downward direction as a rotational axis as compared with an opposite end of the second link 23. A distal end of the end effector 24 is provided with a plurality of holders that hold the wafer W. An actuator that drives elevation of the first link 22, a joint between the base 21 and the first link 22, a joint between the first link 22 and the second link 23, and a joint between the second link 23 and the end effector 24 is controlled by the controller 100.

The end effector 24 is formed in a fork type from which the distal ends are branched, and has a proximal end 240, and two blades (fork branches) 241 and 242 that extend from the proximal end 240. The blades 241 and 242 extend from the proximal end 240 in the same direction, and are formed to have the same height. The blade 241 has holders 243 and 244 that hold a plurality of wafers W along the lengthwise direction of the blade 241. The blade 242 has holders 245 and 246 that hold a plurality of wafers W along the lengthwise direction of the blade 242. In this way, the four wafers W held by the end effector 24 are hold at the same height (on the same plane).

Further, sensors S0 to S7 that detect the wafer W are provided in the interior of the vacuum transfer module VTM. The sensor S0 detects whether the wafer W is held by the holders 243 to 246 in a state in which the end effector 24 of the transfer device ARM1 is located at a reference location (see FIG. 2). The sensor S1 detects whether the wafer W is held and the eccentricity of the held wafer W when the transfer device ARM1 carries the wafer W into the process chamber PM1 or when the transfer device ARM1 carries the wafer W out of the process chamber PM1. Further, the detection method of the sensor S1 will be described later with reference to FIGS. 3A to 3D. Similarly, the sensors S2 to S6 detect whether the wafer W is held and the eccentricity of the held wafer W when the transfer device ARM1 carries the wafer W into the process chambers PM2 to PM6 or when the transfer device ARM1 carries the wafer W out of the process chambers PM2 to PM6. The sensor S7 detects whether the wafer W is held and the eccentricity of the held wafer W when the transfer device ARM1 carries the wafer W into the load lock module LLM or when the transfer device ARM1 carries the wafer W out of the load lock module LLM. The sensors S0 to S7 may be, for example, optical transmission sensors. The detection values of the sensors S0 to S7 are input to the controller 100.

The load lock module LLM is provided between the vacuum transfer module VTM and the loader modules LM1 to LM2. The load lock module LLM is configured to be switched between an ambient air atmosphere and a vacuum atmosphere. The load lock module LLM and the vacuum transfer module VTM in the vacuum atmosphere communicate with each other by opening and closing of the gate valve GV7. The load lock module LLM and the loader module LM1 in the ambient air atmosphere communicate with each other by opening and closing of the gate valve GV8. The load lock module LLM and the loader module LM2 in the ambient air atmosphere communicate by opening and closing of the gate valve GV9. The load lock module LLM has loading tables 31 to 34, on which a total of four wafers W are loaded in a matrix of 2 by 2 when viewed in a plane. Further, arrangement of the loading tables 31 to 34 of the process chambers PM1 to PM6 and arrangement of the loading tables 31 to 34 of the load lock module LLM are the same. Further, the switching of the vacuum atmosphere or the ambient air atmosphere in the load lock module LLM is controlled by the controller 100.

The loader modules LM1 to LM2 are in the ambient air atmosphere, and for example, down flows of clean air are formed therein. Further, a transfer device ARM2 that transfers the wafer W is provided in the interior of the loader module LM1. The transfer device ARM2 carries in and out the wafer W between the load lock module LLM and the loader module LM1 as the gate valve GV8 is opened and closed. Similarly, a transfer device ARM3 that transfers the wafer W is provided in the interior of the loader module LM2. The transfer device ARM3 carries in and out the wafer W between the load lock module LLM and the loader module LM2 as the gate valve GV9 is opened and closed. Further, a delivery device (not illustrated) that loads the wafer W is provided on the lower side of the load lock module LLM. The transfer devices ARM2 and ARM3 may deliver the wafer W through the delivery device. Further, the operation of the transfer devices ARM2 and ARM3 and the opening and closing of the gate valves GV8 to GV9 are controlled by the controller 100.

The transfer device ARM2 includes a multi-joint arm including a base 41, a first link 42, a second link 43, and an end effector 44. One end of the first link 42 is mounted on the base 41 to be rotatable while taking an upward/downward direction as a rotational axis. Further, the base 41 may elevate the first link 42 in the upward/downward direction. One end of the second link 43 is mounted to be rotatable while taking an upward/downward direction as a rotational axis as compared with an opposite end of the first link 42. A proximal end of the end effector 44 is mounted to be rotatable while taking an upward/downward direction as a rotational axis as compared with an opposite end of the second link 43. A distal end of the end effector 44 is provided with a holder 441 that holds the wafer W. An actuator that drives elevation of the first link 42, a joint between the base 41 and the first link 42, a joint between the first link 42 and the second link 43, and a joint between the second link 43 and the end effector 44 is controlled by the controller 100. The transfer device ARM3 includes a multi-joint arm similarly to the transfer device ARM2.

Load ports LP1 and LP2 are provided on a wall surface of the loader module LM1. Further, load ports LP3 and LP4 are provided on a wall surface of the loader module LM2. A carrier, in which the wafer W is accommodated, or an empty carrier C is mounted on the load ports LP1 to LP2. The carrier C may be, for example, a front opening unified pod (FOUP) or the like.

The transfer device ARM2 holds the wafer W accommodated in the load ports LP1 and LP2 in the holder 441 of the transfer device ARM2, and extracts the wafer W. Further, the wafer W held by the holder 441 may be accommodated in the load ports LP1 and LP2. Similarly, the transfer device ARM3 holds the wafer W accommodated in the load ports LP3 and LP4 in the holder of the transfer device ARM3, and extracts the wafer W. Further, the wafer W held by the holder may be accommodated in the load ports LP3 and LP4.

The controller 110 may include a central processing unit (CPU), a read only memory (ROM), a random access memory (RAM), and/or a hard disk drive (HDD). The controller 110 is not limited to an HDD, and may have another memory area, such as a solid state drive (SSD). In a memory area, such as a HDD or a RAM, a recipe in which the sequence of a process, the condition of the process, and a transfer condition are set is stored.

The CPU controls processing of the wafer W in the process chambers PM according to the recipe, and controls the transfer of the wafer W. In the HDD or the RAM, a program that causes the process chambers PM to process the wafer W or transfer the wafer W may be stored. The program may be stored in a storage medium to be provided, or may be provided by an external device through a network.

<Operation of Substrate Processing System>

Next, an example of an operation of the substrate processing system will be described. Here, as an example of an operation of the substrate processing system, an operation of processing the wafer W accommodated in the carrier C mounted on the load port LP1 by the process chamber PM1, and accommodating the wafer W in an empty carrier C mounted on the load port LP3. Further, at an initiation time point of the operation, the gate valves GV1 to GV9 are closed, and the interior of the load lock module LLM corresponds to an ambient air atmosphere.

The controller 100 controls the transfer device ARM2 to extract the first wafer W from the carrier C of the load port LP1 and load the wafer W on a delivery device (not illustrated). Further, the second wafer W is extracted from the carrier C of the load port LP1, and is loaded on the delivery device (not illustrated).

The controller 100 opens the gate valves GV8 and GV9. The controller 100 controls the transfer device ARM3 to extract the first wafer W loaded on the delivery device (not illustrated) and load the wafer W on the loading table 31 of the load lock module LLM. The controller 100 controls the transfer device ARM2 to extract the third wafer W from the carrier C of the load port LP1 and load the wafer W on the loading table 33 of the load lock module LLM.

The controller 100 controls the transfer device ARM3 to extract the second wafer W loaded on the delivery device (not illustrated) and load the wafer W on the loading table 32 of the load lock module LLM. The controller 100 controls the transfer device ARM2 to extract the fourth wafer W from the carrier C of the load port LP1 and load the wafer W on the loading table 34 of the load lock module LLM. If the fourth wafer W is loaded on the loading tables 31 to 34 of the load lock module LLM and the transfer devices ARM2 and ARM3 are retreated from the load lock module LLM, the controller 100 closes the gate valves GV8 and GV9.

The controller 100 controls an exhaustion device (not illustrated) of the load lock module LLM to exhaust interior air and switch the load lock module LLM from the ambient air atmosphere to the vacuum atmosphere.

The controller 100 controls the transfer device ARM1 to move the end effector 24 to a reference location illustrated in FIG. 2. The controller 100 determines that the wafer W is not held by the blades 241 and 242 by using the sensor S0. The controller 100 opens the gate valve GV7. The controller 100 controls the transfer device ARM1 to insert the blades 241 and 242 of the end effector 24 into the load lock module LLM to a preset teaching point, holds the wafers W loaded on the loading tables 31 to 24 of the load lock module LLM, and transfers the wafers W to the vacuum transfer module VTM. Here, the arrangement of the loading tables 31 to 34 of the load lock module LLM is the same as the arrangement of the loading tables 31 to 34 of the processing module PM1. Accordingly, the arrangement of the wafers W held by the blades 241 and 242 of the end effector 24 are the same as the arrangement of the loading tables 31 of the process chamber PM1. If the end effector 24 is retreated from the load lock module LLM, the controller 100 closes the gate valve GV7.

The controller 100 opens the gate valve GV1. The controller 100 controls the transfer device ARM1 to insert the blades 241 and 242 of the end effector 24 into the process chamber PM1 to a preset teaching point and load the held wafers W on the loading tables 11 to 14 of the process chamber PM1. If the end effector 24 is retreated from the process chamber PM1, the controller 100 closes the gate valve GV1.

The controller 100 controls the process chamber PM1 to perform a desired process on the wafer W.

If the processing of the wafer W is completed, the controller 100 opens the gate valve GV1. The controller 100 controls the transfer device ARM1 to insert the blades 241 and 242 of the end effector 24 into the process chamber PM1 to a preset teaching point, hold the wafers W loaded on the loading tables 11 to 14 of the process chamber PM1, and transfers the wafers W to the vacuum transfer module VTM. If the end effector 24 is retreated from the process chamber PM1, the controller 100 closes the gate valve GV1.

The controller 100 opens the gate valve GV7. The controller 100 controls the transfer device ARM1 to insert the blades 241 and 242 of the end effector 24 into the load lock module LLM to a preset teaching point and load the held wafers W on the loading tables 31 to 34 of the load lock module LLM. If the end effector 24 is retreated from the load lock module LLM, the controller 100 closes the gate valve GV7.

The controller 100 controls a suction device (not illustrated) of the load lock module LLM to supply, for example, clean air into the interior and switch the load lock module LLM from the vacuum atmosphere to the ambient air atmosphere.

The controller 100 opens the gate valves GV8 and GV9. The controller 100 controls the transfer device ARM3 to extract the first wafer W loaded on the loading table 31 of the load lock module LLM and accommodate the wafer W in the carrier C of the load port LP3. Moreover, the controller 100 controls the transfer device ARM2 to extract the third wafer W loaded on the loading table 33 of the load lock module LLM and load the wafer W on the delivery device (not illustrated).

Further, the controller 100 controls the transfer device ARM3 to extract the second wafer W loaded on the loading table 32 of the load lock module LLM and accommodate the wafer W in the carrier C of the load port LP3. Moreover, the controller 100 controls the transfer device ARM2 to extract the fourth wafer W loaded on the loading table 34 of the load lock module LLM and load the wafer W on the delivery device (not illustrated). If the fourth wafer W is extracted from the loading tables 31 to 34 of the load lock module LLM and the transfer devices ARM2 and ARM3 are retreated from the load lock module LLM, the controller 100 closes the gate valves GV8 and GV9.

The controller 100 controls the transfer device ARM3 to extract the third wafer W from the delivery device (not illustrated) and load the wafer in the carrier C of the load port LP3. Further, the fourth wafer W is extracted from the delivery device (not illustrated), and is accommodated in the carrier C of the load port LP3.

Although an example of transferring the wafer W to the process chamber PM1 to carry out the wafer W is described above, the wafer W may be transferred to the process chambers PM2 to PM6 and be carried out similarly. Further, the wafer W processed by the process chamber PM1 may be, for example, transferred to the process chamber PM2, and the wafer W may be additionally processed by the process chamber PM2.

<Operation of Loading Wafer W to Process Chamber PM1>

Next, an example of an operation of loading the wafer W held by the transfer device ARM1 on the loading tables 11 to 14 of the process chamber PM1 will be additionally described with reference to FIGS. 3A to 4D. FIGS. 3A to 4D are perspective views illustrating an example of an operation of loading the wafer W on the loading tables 11 to 14 of the process chamber PM1. Further, in FIGS. 3A to 4D illustrate only the end effector 24, the loading tables 11 to 14, the sensor S1, and the wafer W, and illustration of the other configurations is omitted. Further, a description thereof will be made while a direction in which the end effector 24 is inserted into the process chamber PM1 is taken as a progress direction, and a direction in which the end effector 24 is removed from the process chamber PM1 is taken as a retreating direction.

Figure 3A:
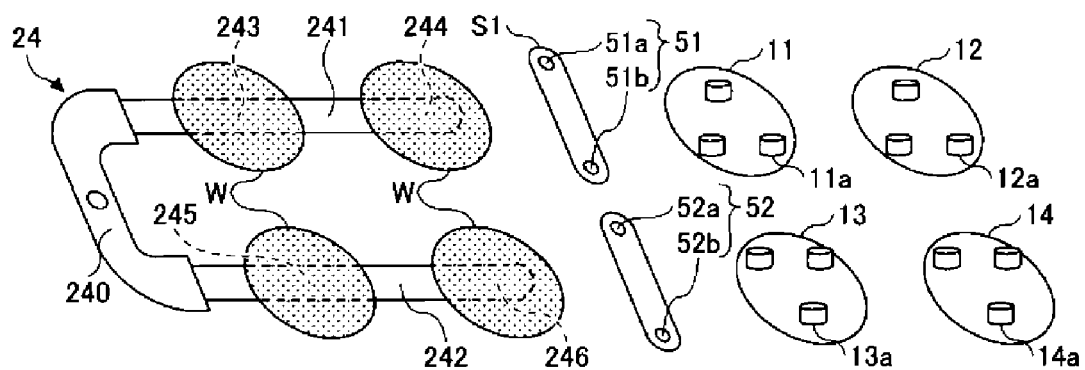
FIGS. 3A to 3D illustrate perspective views for explaining an example of an operation of loading a wafer on a loading table of a process chamber.

As illustrated in FIG. 3A, the controller 100 controls actuators of joints of the transfer device ARM1 to move the end effector 24 such that the loading tables 31 to 34 are located in the extension directions of the blades 241 and 242.

Here, the sensor S1 has sensor units 51 and 52. Further, the number of sensor units may be the same as the number of blades of the end effector 24. The sensor unit 51 is arranged on a path along which the blade 241 enters the process chamber PM1. Further, the sensor unit 52 is arranged on a path along which the blade 242 enters the process chamber PM1.

The sensor unit 51 has two sensor elements 51a and 51b arranged to be spaced apart from each other. The sensor elements 51a and 51b are, for example, optical transmission sensors each having a light transmitter and a light receiver, and detect whether a detection object is present, by irradiating light from the light transmitter and detecting the reflected light from the detection object by the light receiver. The interval between the sensor element 51a and the sensor element 51b is wider than the width of the blade 241 and is smaller than the diameter of the wafer W. Similarly, the sensor unit 52 also has two sensor elements 52a and 52b.

Figure 3B:
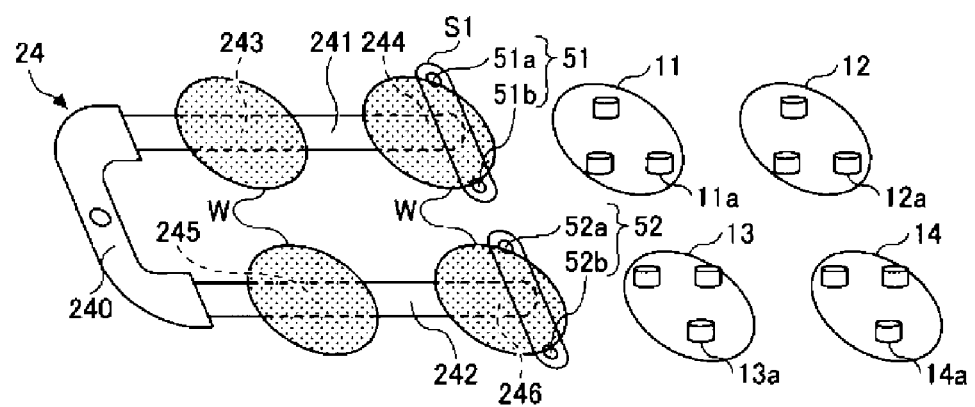

As illustrated in FIG. 3B, the controller 100 controls the actuators of the joints of the transfer device ARM1 to move the end effector 24 forwards. Then, when viewed from the top, the blade 241 passes between the sensor element 51a and the sensor element 51b. As the sensor elements 51a and 51b of the sensor unit 51 detect the wafer W when the holder 244 of the blade 241 is located on the upper side of the sensor unit 51, the controller 100 may determine whether the wafer W is present on the holder 244 on the basis of the detection value of the sensor unit 51. Similarly, as the sensor elements 52a and 52b of the sensor unit 52 detect the wafer W when the holder 246 is located on the upper side of the sensor unit 52, the controller 100 may determine whether the wafer W is present on the holder 246 on the basis of the detection value of the sensor unit 52.

Further, the controller 100 acquires a location of the end effector 24 when the sensor element 51a starts to detect the wafer W, a location of the end effector 24 when the sensor element 51a stops detecting the wafer W, a location of the end effector 24 when the sensor element 51b starts to detect the wafer W, and a location of the end effector 24 when the sensor element 51b stops detecting the wafer W. The controller 100 may detect a location of the wafer W held by the holder 244 from a location information on the four points. Accordingly, the controller 100 may detect a deviation (eccentricity) between the reference point of the holder 244 and the center of the wafer W held by the holder 244, on the basis of the detection value of the sensor unit 51. Similarly, the controller 100 may detect a deviation (eccentricity) between the reference point of the holder 246 and the center of the wafer W held by the holder 246, on the basis of the detection value of the sensor unit 52.

Figure 3C:
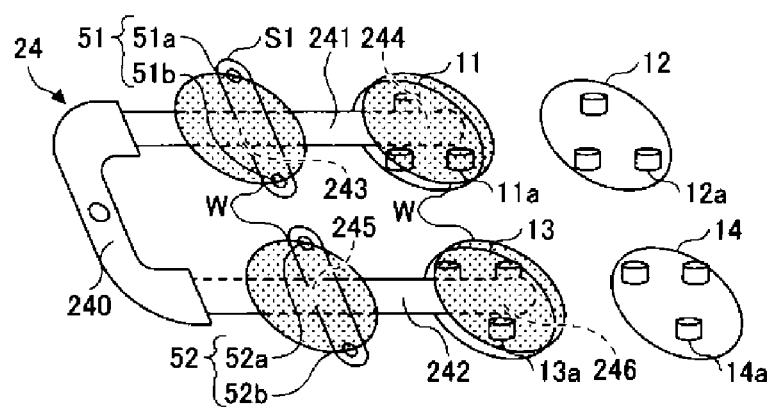

As illustrated in FIG. 3C, the controller 100 controls the actuators of the joints of the transfer device ARM1 to further move the end effector 24 forwards. Then, as the sensor elements 51a and 51b of the sensor unit 51 detect the wafer W when the holder 243 of the blade 241 is located on the upper side of the sensor unit 51, the controller 100 may determine whether the wafer W is present on the holder 243 on the basis of the detection value of the sensor unit 51. Similarly, as the sensor elements 52a and 51b of the sensor unit 52 detect the wafer W when the holder 245 is located on the upper side of the sensor unit 52, the controller 100 may determine whether the wafer W is present on the holder 245 on the basis of the detection value of the sensor unit 52.

Further, the controller 100 may detect a deviation (eccentricity) between the reference point of the holder 243 and the center of the wafer W held by the holder 243, on the basis of the detection value of the sensor unit 51. Similarly, the controller 100 may detect a deviation (eccentricity) between the reference point of the holder 245 and the center of the wafer W held by the holder 245, on the basis of the detection value of the sensor unit 52.

Figure 3D:
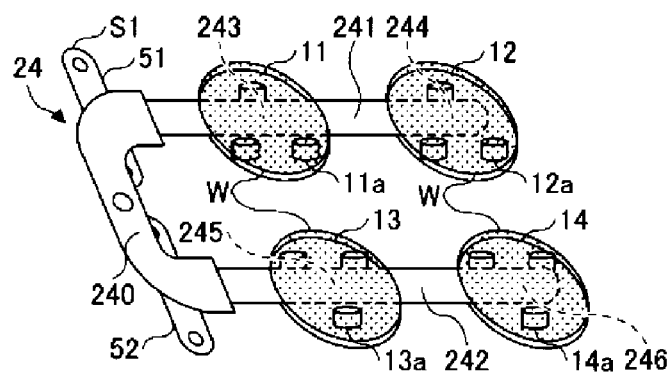

As illustrated in FIG. 3D, the controller 100 controls the actuators of the joints of the transfer device ARM1 to further move the end effector 24 forwards. Accordingly, the wafers W held by the holders 243 to 246 are located on the upper sides of the loading table 11 to 14.

Figure 4A:
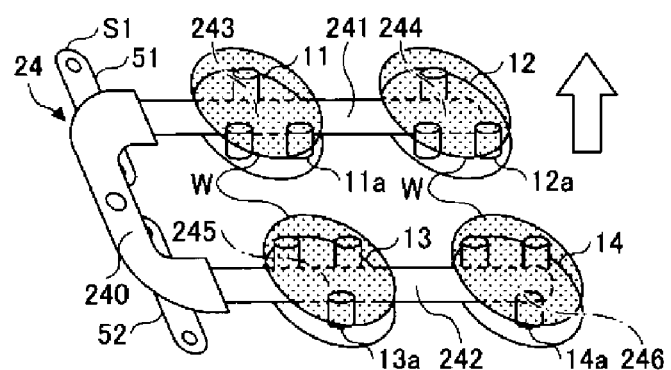
FIGS. 4A to 4D illustrate perspective views illustrating an example of an operation of loading a wafer on a loading table of a process chamber.

Here, the loading tables 11 to 14 have elevation pins 11a to 14a. The elevation pins 11a and 12a are arranged at locations that are different from locations, at which the blade 241 passes, when viewed from the top. Further, the elevation pins 13a and 14a are arranged at locations that are different from locations, at which the blade 242 passes, when viewed from the top. Accordingly, as illustrated in FIG. 4A, when the elevation pins 11a to 14a are lifted, the elevation pins 11a to 14a do not contact the blades 241 and 242, and lift the four wafers W held by the end effector 24. Here, because the heights of the blades 241 and 242 are the same, the four wafers W are held by the end effector 24 at the same height. Accordingly, the elevation pins 11a to 14a may be configured to lift the wafers W in one lifter at the same time.

Figure 4B:
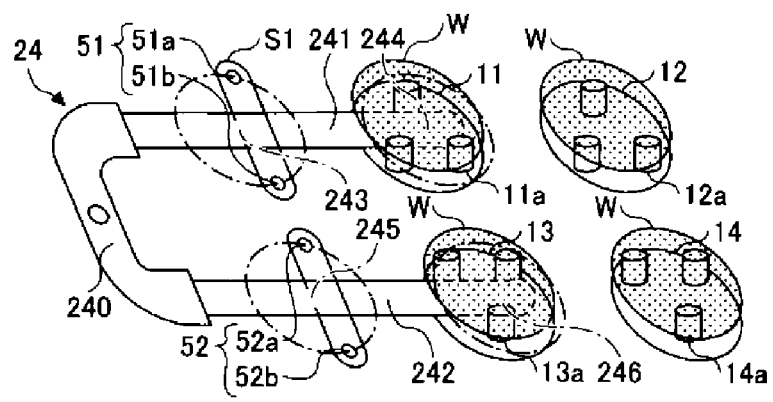

Next, the controller 100 controls the actuators of the joints of the transfer device ARM1 to move the end effector 24 rearwards. Here, as illustrated in FIG. 4B, it is determined that the sensor S1 does not detect the wafer W when the end effector 24 reaches the same location as that of FIG. 3C. That is, the controller 100 determines that a wafer W is not present on the holders 243 and 245, on the basis of the detection value of the sensor S1. Further, in FIGS. 4B and 4C, a location at which the wafer W is loaded is indicated by an alternate long and short dash line.

Figure 4C:
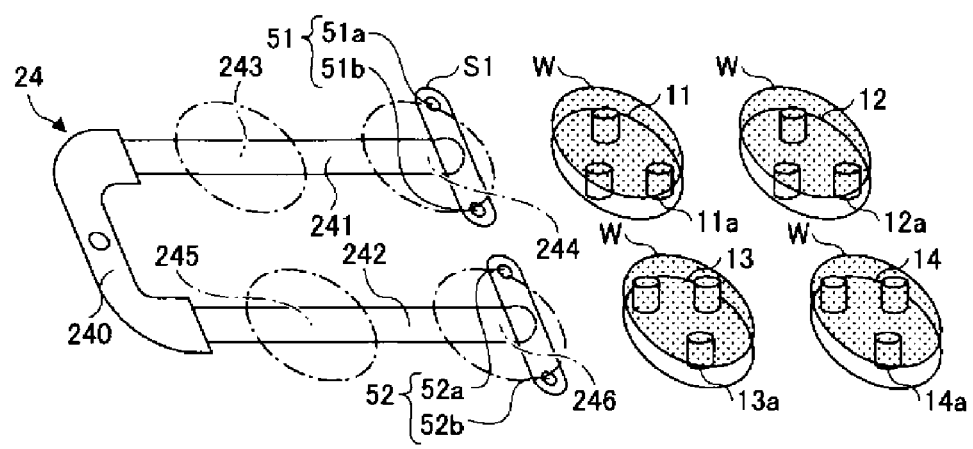

Next, the controller 100 controls the actuators of the joints of the transfer device ARM1 to further move the end effector 24 rearwards. Here, as illustrated in FIG. 4C, it is determined that the sensor S1 does not detect the wafer W when the end effector 24 reaches the same location as that of FIG. 3B. That is, the controller 100 determines that a wafer W is not present on the holders 244 and 246, on the basis of the detection value of the sensor S1.

Figure 4D:
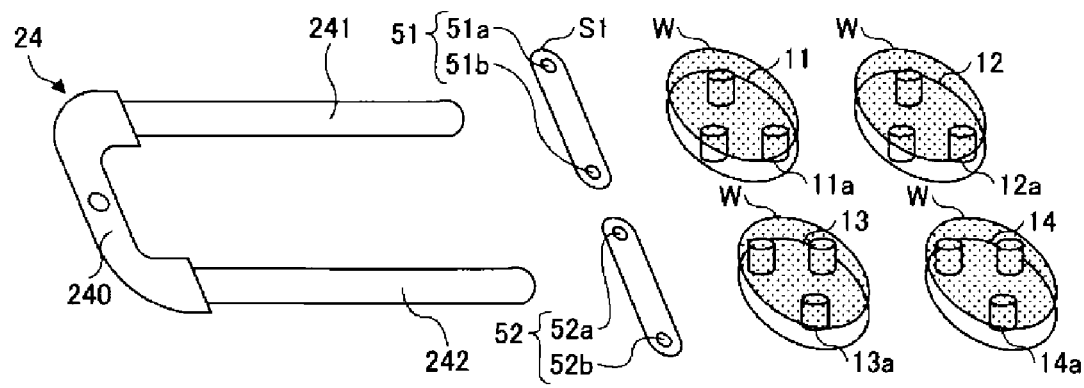

As illustrated in FIG. 4D, the end effector 24 is retreated from the process chamber PM1 by moving the end effector 24 rearwards. Thereafter, the wafers W are loaded on the loading tables 11 to 14 by lowering the elevation pins 11a to 14a.

Although an example of transferring the wafer W to the process chamber PM1 is described above, the sequence illustrated in FIGS. 3A to 4D may be performed in reverse when the wafer W is carried out of the process chamber PM1, and a description thereof will be omitted. Further, this is the same when the wafer W is transferred and carried out of the process chamber PM2 to PM6 or the load lock module LLM, a repeated description will be omitted.

<Operation of Calibrating Location of Wafer W>

Figure 5A:
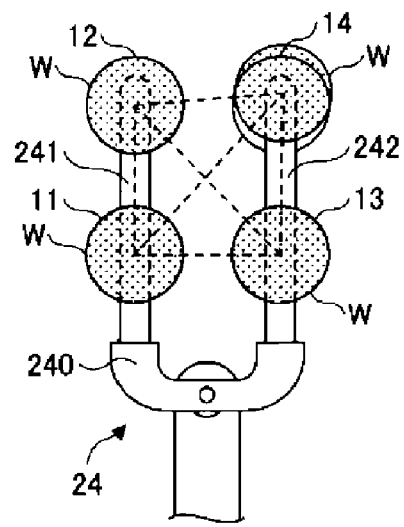
FIGS. 5A and 5B illustrate plan diagrams illustrating an example of calibrating of a location of a wafer.
Figure 5B:
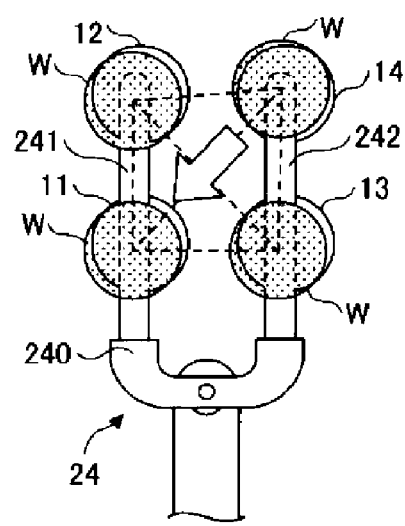

Next, an operation of calibrating the loading location of the wafer W will be described with reference to FIGS. 5A and 5B. FIGS. 5A and 5B illustrate plan diagrams illustrating an example of calibrating a location of the wafer W.

Due to an assembly error between the loading tables 11 to 14 of the process chambers PM1 to PM6 and the loading tables 31 to 34 of the load lock module LLM, a location of the wafer W may deviates. Further, as the process chamber PM1 processes the wafer W by heating the wafer W, a location of the wafer W before the processing and a location of the wafer W after the processing may be different. Further, as the wafer W slides on the blades 241 and 242 due to the inertial force when the transfer device ARM1 transfers the wafer W, a location of the wafer W may deviate. Further, when, for example, film forming is performed on the wafer W by the process chambers PM1 to PM6, the frictional coefficient of the rear surface of the wafer W changes due to the film forming situation.

FIG. 5A illustrates a state in which the end effector 24 is moved forwards to a preset teaching location. Further, the state corresponds to the state illustrated in FIG. 3D, which has been described above. An example of FIG. 5A illustrates that the wafer W held by the holder 246 deviates.

As described above, when the wafer W is carried into the process chamber PM1, the controller 100 detects locations of the centers of the four wafers W by using the sensor S1. Further, FIG. 5A illustrates lines connecting the centers of the wafers W by using broken lines. Further, the transfer device ARM1 has a three degree of freedom of the rotational axis of the base 21 and one end of the first link 22, the rotational axis of an opposite end of the first link 22 and one end of the second link 23, and the rotational axis of an opposite end of the second link 23 and a proximal end of the end effector 24. Accordingly, the transfer device ARM1 may move the end effector 24 in a straight direction (a widthwise direction or a depth direction) and a rotational direction.

The controller 100 moves straightly (in parallel) and rotates the end effector 24 such that the four wafers W fall within allowable ranges of the loading tables 11 to 14 on the basis of the arrangement of the loading tables 11 to 14 and a location of the center of the wafer W. The state after calibration of locations of the wafers W is illustrated in FIG. 5B. That is, in the example illustrated in FIGS. 5A and 5B, the loading tables 11 to 13 increase the deviations of the wafers W in the ranges within the allowable ranges, and the loading table 14 decreases the deviation of the wafer W such that the deviation falls within the allowable range. In other words, the maximum value of the deviation of the wafer W after the calibration of a location of the wafer W is made to be smaller than the maximum value of the deviation of the wafer W before the calibration of a location of the wafer W. Accordingly, the four wafers W may be loaded on the loading tables 11 to 14 at the same time.

Next, another operation of calibrating the loading location of the wafer W will be described with reference to FIGS. 6A and 6B. FIGS. 6A and 6B illustrate plan diagrams illustrating another example of calibrating a location of the wafer W. Here, the elevation pins 11a to 14a are configured to be elevated independently for the respective loading tables 11 to 14.

The controller 100 calculates X components (for example, widthwise direction components) and Y components (for example, depth direction components) of the deviations of the wafers W on the basis of the arrangement of the loading tables 11 to 14 and locations of the centers of the wafers W detected by the sensor S1. An average of the maximum value and the minimum value of the X components is determined to be a compromise value of the X components. An average of the maximum value and the minimum value of the Y components is determined to be a compromise value of the Y components.

The controller 100 determines whether the deviations of the wafers W fall within the allowable ranges when the end effector 24 is moved in the X direction only by the compromise value of the X components and is moved in the Y direction only by the compromise value of the Y components. When the deviations of the wafers W fall within the allowable ranges of all the loading tables 11 to 14, the controller 100 controls the transfer device ARM1 to move the end effector 24 on the basis of the compromise values of the X components and the Y components.

Meanwhile, when the deviations of the wafers W do not fall within the allowable ranges of the at least one or more loading tables 11 to 14, the loading tables 11 to 14 are clustered. For example, the loading table 14 is determined to be a first cluster, and the loading tables 11 to 13 are determined to be second clusters. The controller 100 calculates the compromise values of the X components and the Y components for the respective clusters, and determines whether the deviations of the wafers W fall within the allowable ranges when the wafers W move according to the compromise values of the X components and the Y components for the respective clusters. When the deviations do not fall within the allowable ranges, the clusters are reset.

As illustrated in FIG. 6A, the controller 100 controls the transfer device ARM1 to move the end effector 24 on the basis of the compromise value of the first cluster. The controller 100 lifts the wafer W loaded on the loading table 14 by lifting the elevation pin 14a of the loading table 14.

Next, as illustrated in FIG. 6B, the controller 100 controls the transfer device ARM1 to move the end effector 24 on the basis of the compromise value of the second cluster (see a white arrow). Thereafter, the controller 100 lifts the wafers W loaded on the loading tables 11 to 13 by lifting the elevation pins 11a to 13a of the loading tables 11 to 13.

Hereinafter, although illustration is omitted, the controller 100 controls the transfer device ARM1 to move the end effect 24 rearwards and retreat the end effector 24 from the process chamber PM1. Thereafter, the controller 100 lowers the elevation pins 11a to 14a to load the wafers W on the loading tables 11 to 14. Accordingly, the four wafers W may be loaded on the loading tables 11 to 14.

Figure 7A:
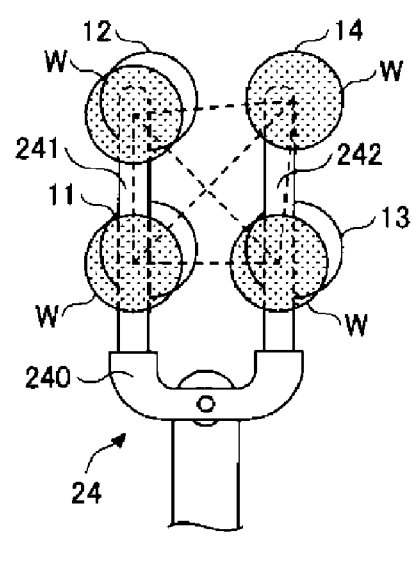

Next, another operation of calibrating the loading location of the wafer W will be described with reference to FIGS. 7A and 7B. FIGS. 7A and 7B illustrate plan diagrams illustrating another example of calibrating a location of the wafer W.

Here, the elevation pins 11a to 14a are configured to be elevated independently for the respective loading tables 11 to 14.

First, similar to the case of the operation illustrated in FIGS. 6A and 6B, the controller 100 calculates compromise values and, when the compromise values do not fall within the allowable ranges, clusters the loading tables 11 to 14. For example, the loading table 14 is determined to be a first cluster, and the loading tables 11 to 13 are determined to be second clusters.

As illustrated in FIG. 7A, the controller 100 controls the transfer device ARM1 to move the end effector 24 on the basis of the compromise value of the first cluster. The controller 100 lifts the wafer W loaded on the loading table 14 by lifting the elevation pins 14a of the loading table 14.

Next, as illustrated in FIG. 7B, the controller 100 controls the transfer device ARM1 to move the end effect 24 rearwards and retreat the end effector 24 from the process chamber PM1. Further, the elevation pin 14a remains lifted, and is in a state in which the wafer W loaded on the loading table 14 is lifted.

Figure 7C:
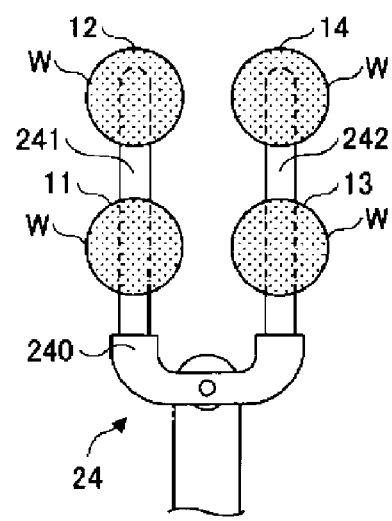

Further, as illustrated in FIG. 7C, the controller 100 controls the transfer device ARM1 to move the end effector 24 on the basis of the compromise value of the second cluster. The controller 100 lifts the wafers W loaded on the loading tables 11 to 13 by lifting the elevation pins 11a to 13a of the loading tables 11 to 13.

Hereinafter, although illustration is omitted, the controller 100 controls the transfer device ARM1 to move the end effect 24 rearwards and retreat the end effector 24 from the process chamber PM1. Thereafter, the controller 100 lowers the elevation pins 11a to 14a to load the wafers W on the loading tables 11 to 14. Accordingly, the four wafers W may be loaded on the loading tables 11 to 14.

Further, although it has been described that the elevation pin 14a remains lifted in the states of the FIGS. 7B and 7C and the four wafers W are loaded on the loading tables 11 to 14 after the state illustrated in FIG. 7C, the present disclosure is not limited thereto. For example, in the state in which the end effector 24 is retreated from the process chamber PM1 illustrated in FIG. 7B, first, the wafer W may be loaded on the loading table 14 by lowering the elevation pin 14a. Thereafter, the wafers W loaded on the loading tables 11 to 13 may be transferred by moving the end effector 24 into the process chamber PM1.

Further, in the example illustrated in FIGS. 7A to 7C, the wafer W of the loading table 11 cannot be delivered earlier than the wafer W of the loading table 12. Accordingly, the sequence of the clusters is selected such that the wafer W of the loading table 12 is delivered earlier than the wafer W of the loading table 11 or at the same time. Similarly, the sequence of the clusters is selected such that the wafer W of the loading table 13 is delivered earlier than the wafer W of the loading table 14 or at the same time. Further, when the separation of the clusters is a combination of opposite angles, the number of divisions of the clusters may be increased and then the wafers W may be delivered. For example, when the loading tables 11 and 14 are determined to be first clusters, and the loading tables 12 and 13 are determined to be second clusters in the separation of the clusters determined on the basis of the compromise values, for example, the first clusters may be divided into two. That is, the loading table 14 is determined to be a first cluster, the loading tables 12 and 13 are determined to be second clusters, and the loading table 11 is determined to be a third cluster. Accordingly, the wafers W may be delivered sequentially for the clusters. Further, an operation of not retreating the end effector 24 illustrated in FIGS. 6A and 6B may be performed. In this way, the method for delivering the wafers W may be properly selected.

Further, although the loading table 14 is determined to be a first cluster and the loading tables 11 to 13 are determined to be second clusters in the examples illustrated in FIG. 6A to 7C, the present disclosure is not limited thereto, and may be another combination. Further, the number of clusters is not limited to two, and may be three or more. Further, as the number of clusters becomes smaller, it is preferable that the time required for loading the wafers W may be shortened.

Further, in the example illustrated in FIGS. 6A and 6B, a location of the end effector 24 based on the compromise value of the first cluster is moved to a location of the end effector 24 based on the compromise value of the second cluster. Accordingly, the example illustrated in FIGS. 6A and 6B is preferable on an aspect of shortening the transfer time of the wafer W.

Further, in the example illustrated in FIGS. 7A to 7C, after the end effector 24 is retreated from the process chamber PM1, the end effector 24 is inserted into the process chamber PM1 again. Then, by the sensor S1, a location of the wafer W may be detected again. Accordingly, the example illustrated in FIGS. 7A to 7C is preferable on an aspect of the precision of calibration of the loading locations of the wafers W.

Next, another operation of calibrating the loading location of the wafer W will be described with reference to FIG. 8. FIG. 8 is a plan view illustrating a configuration of an example of the substrate processing system according to another embodiment. Here, it is described that the process chamber PM3 is used as the process chamber.

In the example illustrated in FIGS. 5A and 5B, the loading locations are calibrated through an operation of the transfer device ARM1, and in the example illustrated in FIGS. 6A and 6B, an example of calibrating the loading locations through operations of the transfer device ARM1 and the elevation pins 11a to 14a is described. In the example illustrated in FIG. 8, an example of calibrating the loading locations through operations of the transfer devices ARM2 and ARM 3 is described.

As illustrated in FIG. 8, the arrangement of the loading tables 11C to 14C in the process chamber PM3 is distorted from an ideal matrix arrangement, for example, due to an assembly error. The arrangement of the loading tables 11C to 14C distorted due to the assembly error may be recognized in advance. Information indicating the deviation of the arrangement of the loading tables 11C to 14C is input to the controller 100.

When a wafer W is carried from loader modules LM1 to LM2 to a load lock module LLM in a substrate processing system according to another embodiment, the controller 100 controls the transfer devices ARM2 and ARM3 to load the wafers W on the loading tables 31 to 34, on the basis of a preset teaching point and the information indicating the deviation of the arrangement of the loading tables 11C to 14C. The wafer W loaded in this way appears as a wafer W1. Further, the transfer devices ARM2 and ARM3 have a configuration of transferring wafers W one by one, and locations of the wafers W may be easily adjusted.

When the wafers W are carried from the load lock module LLM into the process chamber PM3 via the vacuum transfer module VTM, as illustrated in the wafers W2, the transfer device ARM1 transfers the four wafers W1 acquired from the loading tables 31 to 34 to the process chamber PM3 while locational relationships of the four wafers W1 are held. Accordingly, locational deviations of the wafers W3 loaded on the loading tables 11C to 14C of the process chamber PM3 fall within the allowable ranges. Further, the four wafers W3 may be loaded on the loading tables 11C to 14C at the same time.

In this way, according to the calibration method illustrated in FIG. 8, the time, for which the blades 241 and 242 stay in the process chamber PM, can be reduced. Accordingly, the influence of the heat of the blades 241 and 242 received from the process chamber PM, which is at a high temperature, can be reduced. Further, the processing of the process chamber PM is stopped while the transfer device ARM1 is being transferred, and the productivity of the entire system is enhanced by shortening the transfer time of the transfer device ARM1.

Although an example of transferring and carrying the wafers W out of the process chamber PM3 is described above, the same may be applied to the other process chambers PM. That is, information indicating deviation of the arrangements of the loading tables of the process chambers PM1 to PM6 are input to the controller 100. When the wafers W are carried from the loader modules LM1 to LM2 to the load lock module LLM, the controller 100 switches information indicating the deviation of the arrangement according to which process chamber PM1 to PM6 the carried wafers W are to be transferred to, and loads the wafers W on the loading tables 31 to 34 on the basis of the information indicating the deviation of the arrangement of a preset teaching point and the arrangement of the loading tables 11C to 14C. The transfer device ARM1 transfers the four wafers W acquired from the loading tables 31 to 34 to the specified process chambers PM1 to PM6 while the locations of the wafers W are held. Accordingly, even if deviations of the arrangements of the loading tables for the respective process chambers PM1 to PM6 are different, deviations of the locations may fall within the allowable ranges. Further, the four wafers W3 may be loaded on the loading tables at the same time.

As described above, according to the substrate processing system according to the present embodiment, a plurality of wafers W may be carried into and out of the process chambers PM that process a plurality of wafers W at the same time. Accordingly, as compared with a configuration in which the transfer device of the vacuum transfer module VTM transfers the wafers W one by one, the substrate processing system according to the present embodiment can shorten the time require to carry the wafers W in and out, and the productivity of the entire system can be enhanced.

Further, the substrate processing system according to the present embodiment, the number of the actuators can be reduced as compared with the configuration in which a plurality of multi-joint arms are provided as a transfer device of a vacuum transfer module VTM as disclosed in patent document 1.

Further, in the substrate processing system according to the present embodiment, the openings of the process chambers PM1 to PM6, which are opened and closed by the gate valves GV1 to GV6 and the openings of the load lock modules LLM, which are opened and closed by the gate valve G7, only have to secure the widths, by which the blades 241 and 242 holding the wafers W may enter. Further, the wafers W held by the blades 241 and 242 can be held by the same plane, and the height of the openings can be reduced. Accordingly, the cross-sectional areas of the openings can be made small. By reducing the cross-sectional areas of the openings, for example, discharge of heat from the process chambers PM to the vacuum transfer modules VTM can be reduced.

According to an embodiment of the present disclosure, a substrate processing system that transfers a plurality of substrates to loading tables is provided.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing system comprising:
   a first chamber comprising loading tables, on which a plurality of substrates are to be loaded;
   a second chamber comprising loading tables, on which a plurality of substrates are to be loaded;
   a first transfer device comprising a plurality of blades configured to hold a plurality of substrates in a lengthwise direction thereof, and configured to transfer a plurality of substrates loaded on the loading tables of the first chamber to the loading tables of the second chamber with the substrates held at the same height;
   a substrate sensor provided on paths, along which the blades enter the second chamber, and configured to detect a substrate held by the blades; and
   a controller configured to control the first transfer device.

2. The substrate processing system of claim 1, wherein the substrate sensor is configured to detect a location of the substrate held by the blades.

3. The substrate processing system of claim 2, wherein the substrate sensor comprises sensor units, which correspond to the blades, respectively, and
   wherein each of the sensor units comprises a plurality of sensor elements arranged to be spaced apart from each other by more than a width of a corresponding one of the blades.

4. The substrate processing system of claim 3, wherein the controller detects a location of the substrate held by the blades, based on a location of the blades when a substrate detection by a first sensor element of the sensor units is started, a location of the blades when the substrate detection by the first sensor element of the sensor units is stopped, a location of the blades when a substrate detection by a second sensor element of the sensor units is started, and a location of the blades when the substrate detection by the second sensor element of the sensor units is stopped.

5. The substrate processing system of claim 4, wherein the controller performs:
   detecting the location of the substrate held by the blades by the substrate sensor by causing the blades to enter the second chamber;
   calibrating the location of the blades based on a result of the detecting; and
   delivering the substrate held by the blades to the loading tables of the second chamber.

6. The substrate processing system of claim 5, wherein the plurality of blades are two blades, each of which is configured to hold two substrates in the lengthwise direction, and the first transfer device is configured to hold four substrates at the same height.

7. The substrate processing system of claim 6, wherein the plurality of blades extend in the same direction.

8. The substrate processing system of claim 7, wherein the loading tables of the second chamber includes an elevation pin configured to lift the substrate held by the blades, and the elevation pin is provided at a location that is different from the paths, along which the blades enter the second chamber.

9. The substrate processing system of claim 2, wherein the controller performs:
- detecting the location of the substrate held by the blades by the substrate sensor by causing the blades to enter the second chamber;
- calibrating the location of the blades based on a result of the detecting; and
- delivering the substrate held by the blades to the loading tables of the second chamber.

10. The substrate processing system of claim 2, wherein the controller performs:
- detecting the location of the substrate held by the blades by the substrate sensor by causing the blades to enter the second chamber;
- separating the loading tables of the second chamber to a plurality of clusters on the basis of a result of the detecting; and
- delivering the substrate held by the blades to the loading tables of the second chamber, for the respective clusters.

11. The substrate processing system of claim 10, wherein compromise values are calculated for the respective clusters, the blades are moved based on the compromise values for the respective clusters, and performing sequentially the delivering for the respective clusters.

12. The substrate processing system of claim 1, wherein the substrate sensor comprises sensor units, which correspond to the blades, respectively, and wherein each of the sensor units comprises a plurality of sensor elements arranged to be spaced apart from each other by more than a width of a corresponding one of the blades.

13. The substrate processing system of claim 1, further comprising:
- a second transfer device configured to load substrates on the loading tables of the first chamber,
- wherein the controller performs:
- controlling the second transfer device to load substrates on the loading tables of the first chamber based on an arrangement of the loading tables of the second chamber;
- controlling the first transfer device to hold substrates on the blades while an arrangement of the substrates loaded on the loading tables of the first chamber is held, and cause the blades, on which the substrates are held, to enter the second chamber; and
- delivering the substrates held by the blades to the loading tables of the second chamber.

14. The substrate processing system of claim 1, wherein the plurality of blades are two blades, each of which is configured to hold two substrates in the lengthwise direction, and the first transfer device is configured to hold four substrates at the same height.

15. The substrate processing system of claim 1, wherein the plurality of blades extend in the same direction.

16. The substrate processing system of claim 1, wherein the loading tables of the second chamber includes an elevation pin configured to lift the substrate held by the blades, and the elevation pin is provided at a location that is different from the paths, along which the blades enter the second chamber.

* * * * *